(12) United States Patent
Petti (10) Patent No.: US 7,101,764 B2
(45) Date of Patent: Sep. 5, 2006

(54) HIGH-VOLTAGE TRANSISTOR AND FABRICATION PROCESS

(75) Inventor: Christopher J. Petti, Mountain View, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 0 days.

(21) Appl. No.: 10/247,073

(22) Filed: Sep. 18, 2002

(65) Prior Publication Data

US 2003/0022452 A1 Jan. 30, 2003

Related U.S. Application Data

(62) Division of application No. 09/823,503, filed on Mar. 30, 2001, now Pat. No. 6,501,139.

(51) Int. Cl.
*H01L 21/336* (2006.01)

(52) U.S. Cl. ............... 438/286; 438/305; 438/528; 257/408; 257/E21.427; 257/E21.059

(58) Field of Classification Search ............ 438/286, 438/305, 525, 427, 528; 257/408, E21.427, 257/E21.059
See application file for complete search history.

(56) References Cited

U.S. PATENT DOCUMENTS

| | | | | |
|---|---|---|---|---|
| 5,488,244 A | * | 1/1996 | Quek et al. ............... 257/314 |
| 5,512,495 A | * | 4/1996 | Mei et al. ................. 438/286 |
| 5,780,341 A | * | 7/1998 | Ogura ....................... 438/259 |
| 5,786,617 A | | 7/1998 | Merrill et al. |
| 5,896,314 A | * | 4/1999 | Chen ....................... 365/185.01 |
| 5,904,531 A | * | 5/1999 | Liaw ........................ 438/296 |
| 5,910,670 A | * | 6/1999 | Ludikhuize ............... 257/343 |
| 5,926,706 A | * | 7/1999 | Liaw et al. ............... 438/238 |
| 6,140,189 A | * | 10/2000 | Hsu et al. ................. 438/294 |
| 6,222,235 B1 | * | 4/2001 | Kojima et al. ........... 257/355 |
| 6,262,459 B1 | * | 7/2001 | Tung ....................... 257/389 |
| 6,284,603 B1 | * | 9/2001 | Ho Simon et al. ....... 438/264 |
| 6,291,325 B1 | * | 9/2001 | Hsu ......................... 438/525 |
| 6,372,530 B1 | | 4/2002 | Lee |
| 6,383,876 B1 | | 5/2002 | Son et al. |
| 6,384,457 B1 | * | 5/2002 | Tyagi et al. ............. 257/408 |
| 6,413,823 B1 | * | 7/2002 | Wu et al. ................. 438/270 |
| 6,518,122 B1 | * | 2/2003 | Chan et al. .............. 438/257 |
| 6,703,659 B1 | * | 3/2004 | Chan et al. .............. 257/314 |
| 2002/0027822 A1 | * | 3/2002 | Candelier et al. ....... 365/225.7 |

OTHER PUBLICATIONS

Wolf and Tauber, Silicon Processing for the VLSI Era vol. I; Process Technology; p. 289; 1986 Lattice Press; Sunset Beach, CA.*

(Continued)

*Primary Examiner*—Fernando L. Toledo
(74) *Attorney, Agent, or Firm*—Brinks Hofer Gilson & Lione (57) ABSTRACT

A high-voltage transistor and fabrication process in which the fabrication of the high-voltage transistor can be readily integrated into a conventional CMOS fabrication process. The high-voltage transistor of the invention includes a channel region formed beneath a portion of the gate electrode after the gate electrode has been formed on the surface of a semiconductor substrate. In a preferred embodiment, the channel region is formed by the angled ion implantation of dopant atoms using an edge of the gate electrode as a doping mask. The high-voltage transistor of the invention further includes a drain region that is spaced apart from the channel region by a portion of a well region and by an isolation region residing in the semiconductor substrate. By utilizing the process of the invention to fabricate the high-voltage transistor, the transistor can be integrated into an existing CMOS device with minimal allocation of additional substrate surface area.

22 Claims, 4 Drawing Sheets

OTHER PUBLICATIONS

Sze, "Physics of Semiconductor Devices," Second Edition, John Wiley & Sons, pp. 98-103 (1981).

Baliga, Jayant, "Power Metal-Oxide-Semiconductor Field-Effect Transistors," *Modern Power Devices*, pp. title page, copyright page and 264-266 (1987).

Ballan, Hussein and Michel Declercq, "MOSFET High-voltage technologies," *High Voltage Devices and Circuits in Standard CMOS Technologies*, pp. title page, copyright page and 56-58 (1999).

Bassin, Cedric, Hussein Ballan and Michel Declercq, "High-Voltage Devices for o.5-μm Standard CMOS Technology," *IEEE Electron Device Letters*, vol. 21, No. 1, pp. 40-42 (Jan. 2000).

Hori, Takashi, Junji Hirase, Yoshinori Odake and Takatoshi Yasui, Deep-Submicrometer Large-Angle-Tilt Implanted Drain (LATID) Technology, *IEEE Electron Device Letters*, vol. 39, No. 10, pp. 2312-2324 (Oct. 1992).

Wolf, "Silicon Processing for the VLSI Era", Lattice Press, vol. 3, p. 591-592 (1995).

* cited by examiner

HIGH-VOLTAGE TRANSISTOR AND FABRICATION PROCESS

This application is a divisional of application Ser. No. 09/823,503, filed Mar. 30, 2001, which is hereby incorporated by reference, now U.S. Pat. No. 6,501,139.

FIELD OF THE INVENTION

The present invention relates to semiconductor devices and to their fabrication and, more particularly, to high-voltage transistors and to their fabrication in complimentary-metal-oxide-semiconductor (CMOS) devices.

BACKGROUND OF THE INVENTION

Complex signal processing devices, such as digital signal processing devices, and the like, are used in numerous electronic devices, such as video processing modules, flat panel displays, ink jet printers and the like. The fabrication of such devices requires the integration of high-voltage transistors and low-voltage transistors in the same device. Additionally, since the signal processing devices are required to function at relatively low operational power, they are typically fabricated as CMOS devices. The integration of high-voltage transistors and low-voltage transistors is problematic because the two types of transistors widely differ in their geometric characteristics and operational ranges. For example, high-voltage transistors are required to transfer voltages at much higher levels than low-voltage transistors. High-voltage transistors typically handle about 10V or more, while low-voltage transistors are designed to operate at a supply voltage of less than 5V, typically about 1 to 3V. Accordingly, high-voltage transistors have gate lengths that can be an order of magnitude larger than low-voltage transistors. In the state-of-the-art devices, the low-voltage transistors are fabricated to have gate lengths in the sub-micron range.

Further complications arise in CMOS fabrication as a result of the requirement to fabricate both n-type and p-type transistors in the same device. The fabrication of transistors of different conductivity type requires the formation of well regions in the semiconductor substrate. Attention must be placed on the relative doping concentration levels to avoid performance degradation resulting from parasitic capacitance and the like.

In order to integrate the high-voltage transistors in device fabrication, manufacturers have explored the integration of both vertically-oriented and laterally-oriented transistor architecture. Lateral orientation offers the ability to access the terminals of the high-voltage transistors from the upper surface of the device. A diffused-metal-oxide-semiconductor (DMOS) structure, in which the channel region is laterally diffused underneath a gate electrode, into a region of opposite dopant type, is a common technique for fabricating a laterally-oriented, high-voltage transistor. The region into which the channel is diffused, called the drift region, becomes part of the MOS drain. The DMOS device supports a high voltage because the drift region is more lightly doped than the channel region; thus the voltage drop is spread across the wider drift region rather than the narrower channel region. The DMOS structure has the advantage of having a self-aligned gate in which the channel region is precisely aligned to the gate electrode. Although the DMOS structure can be fabricated to have precisely oriented components, the thermal processing required to diffuse the channel region is generally incompatible with the shallow junctions required to fabricate the low-voltage transistors.

In order to fabricate high-voltage transistors and avoid the thermal processing required for DMOS devices, laterally-oriented high-voltage transistors can also be fabricated by utilizing the well regions that support the CMOS device structure. In particular, an n-channel MOS (NMOS) high-voltage transistor can be fabricated using the p-well as the channel region of the device and the adjacent n-well as the drain/drift region of the device.

While avoiding the necessity of extensive thermal processing to diffuse the channel region, the use of well regions means that the high-voltage transistor cannot be fabricated with a self-aligned gate. Accordingly, the misalignment of the channel region to the gate is possible with the accompanying loss of device performance. To compensate for the potential misalignment of the channel region, the gate electrode can be fabricated to have larger dimensions. However, the increased size of the gate electrode requires a larger surface area for fabrication of the high-voltage transistor resulting in a undesirably large devices. Additionally, the utilization of a well region for device components is problematic in CMOS technology using compensated n-well structures, in which the n-well region is implanted into the p-well region. In these structures, the n-well has a higher doping concentration than the p-channel region; thus it is not an ideal drift region. Therefore, such structures are susceptible to avalanche breakdown during the voltage stressing experience by the well regions during operation of the high-voltage transistor. Additionally, excessively high substrate current can result from impact ionization at voltages near the avalanche limit of the device.

The demand for high performance complex devices requires that they be fabricated to have maximum operational efficiency and be readily integrated into a CMOS process. Additionally, to avoid the necessity of dramatically increasing the geometric dimensions of the device, the high-voltage transistors must not require vast increases in substrate area over that commonly required for low-voltage transistor fabrication. Accordingly, advances in high-voltage architecture and fabrication are necessary to achieve high performance devices compatible with sub micron CMOS technology.

BRIEF SUMMARY

In accordance with the invention, a process for fabricating a high-voltage transistor includes forming a gate dielectric layer on a substrate having a first region, in which an isolation region resides within the first region. A gate electrode is fabricated to overlie at least a portion of the first well region, a portion of the second well region and a portion of the isolation region. A channel region is formed beneath the gate electrode by implanting ions into the substrate using an edge of the gate electrode as an implantation mask. The ions are implanted at an angle of incidence that is offset from a normal of the substrate surface. An electrical contact is formed to the first region, where the electrical contact is separated from the channel region by the isolation region.

In another aspect of the invention a high-voltage transistor is provided that includes an isolation region residing within a doped region of a substrate. The isolation region has substantially vertical sidewalls. A gate electrode overlies a portion of the doped region and a portion of the isolation region and is separated from the substrate by a gate dielectric layer. A channel region underlies at least a portion of the gate electrode and is separated from the isolation region by a portion of the doped region.

In yet another aspect of the invention, a semiconductor device is provided having both a high-voltage transistor and a low-voltage transistor. The method of forming the channel region for the high-voltage transistor avoids excessive thermal processing, such that shallow junctions can be preserved in the low-voltage transistors. In particular, the junction depth of the channel region of the low-voltage transistor can be maintained at a design tolerance of less than about 50% of the junction depth of the source and drain regions of the low-voltage transistor.

The high-voltage transistor and fabrication process of the invention provide a fully self-aligned transistor architecture, while avoiding the extensive thermal processing found in the prior art. Additionally, the separation of the drain region from the channel region is achieved by using a high-density isolation process, such as shallow trench isolation, and results in the fabrication of a device having a relatively small substrate surface area. These and other advantages of the invention are fully set forth herein below.

DETAILED DESCRIPTION THE PREFERRED EMBODIMENTS

Figure 1:
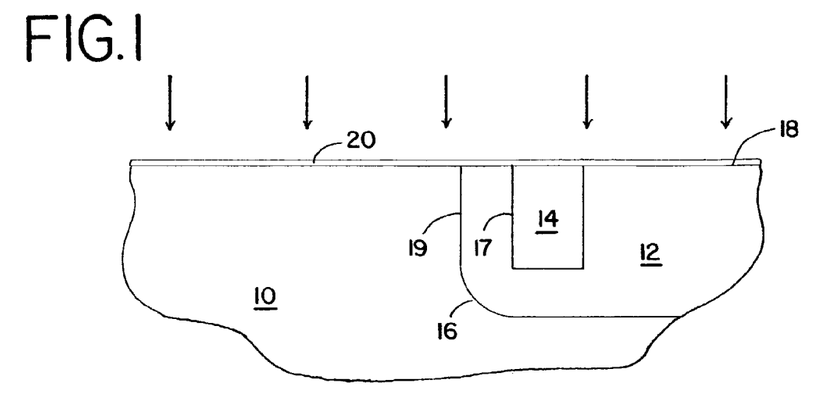
FIGS. 1–5 illustrate, in cross-section, processing steps in accordance with the invention.

Shown in FIG. 1, in cross-section, is a portion of a semiconductor substrate 10 having already undergone several processing steps in accordance with the invention. For the purpose of illustrating the invention, the process will be described in the context of the fabrication of an n-channel device. However, those skilled in the art will appreciate that in the fabrication of CMOS devices, p-channel devices are also fabricated. Accordingly, those skilled in the art will recognize that conductive materials having an opposite conductivity type are equally applicable.

Semiconductor substrate 10 includes a n-type well region 12 having an isolation region 14 residing therein. The portion of substrate 10 shown in FIG. 1 is preferably doped to have a p-type conductivity. Although not designated as such, the remaining portion of substrate 10 illustrated in FIG. 1 can also be a portion of a well region, which can be n-type or undoped. N-type well region 12 is created by doping p-type substrate 10 with an n-type dopant, such as phosphorous or arsenic. The doping process creates a p-n junction 16 in semiconductor substrate 10. Those skilled in the art will recognize that many different kinds of doping processes can be used to form well region 12. Well region 12 is preferably formed by the ion implantation of phosphorous using an ion implantation dose of about $4 \times 10^{12}$ to about $8 \times 10^{12}$ ions/cm$^2$ and, more preferably, about $5 \times 10^{12}$ to about $6 \times 10^{12}$ ions/cm$^2$ and, most preferably, about $5.7 \times 10^{12}$ ions/cm$^2$.

Isolation region 14 is preferably a trench isolation region fabricated by etching a trench in semiconductor substrate 10, followed by silicon oxide deposition and subsequent planarization. To form isolation region 14, a trench is etched into substrate 10 preferably to a depth of about 0.25 to about 0.5 microns and, more preferably about 0.3 microns. A fill material such as silicon oxide or silicon nitride is then deposited by chemical-vapor-deposition (CVD) to fill the trench. Preferably, the fill material is planarized by chemical-mechanical-polishing (CMP). The CMP process forms a relatively flat, planer surface across substrate 10, which defines a principal surface 18. Those skilled in the art will recognize that various additional processes can be carried out during the fabrication of isolation region 14, such as the formation of liner layers and polish stop layers and the like.

In accordance with an alternative embodiment of the invention, isolation region 14 is formed by a localized-oxidation-of-silicon (LOCOS) process. Preferably, the LOCOS process is modified to contain the lateral spread of the isolation region during the oxidation process. Those skilled in the art will appreciate that a number of modified LOCOS processes are know in which the lateral spread of "bird's beak" is reduced by the use of additional layers, such a silicon nitride liners and the like.

In accordance with the invention, isolation region 14 has substantially vertical sidewalls and that are substantially perpendicular to principal surface 18, such that the isolation region does not undesirably extend in a direction parallel to principal surface 18 beyond a predetermined limit. For example, isolation region 14 is fabricated in such a way that a sidewall 17 facing p-n junction 16 does not approach the vertical portion 19 of p-n junction by more than about 20% of the width of the isolation region.

After forming isolation region 14, a gate dielectric layer 20 is formed to overlie principal surface 18. Preferably, gate dielectric layer 20 is formed by the thermal oxidation of principal surface 18 to form a silicon oxide layer thereon. Alternatively, gate dielectric layer 20 can be a deposited material, such as a silicon nitride or a composite of silicon oxide and silicon nitride.

Figure 2:
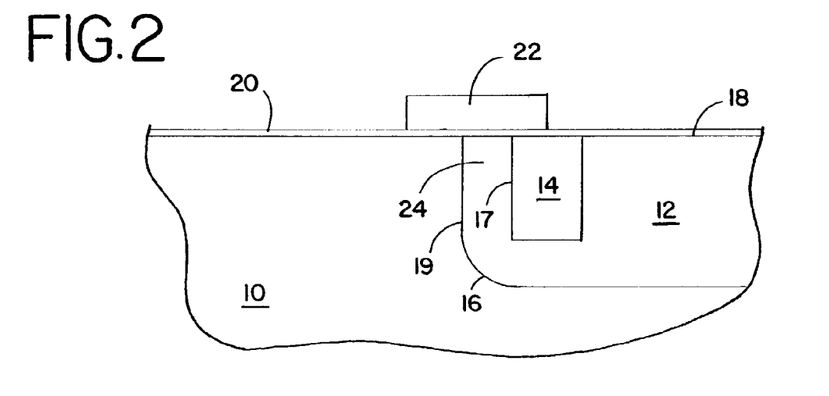

After forming gate dielectric layer 20, a gate electrode 22 is formed on gate dielectric layer 20, as illustrated in FIG. 2. Preferably, gate electrode 22 overlies a portion of isolation region 14 and a portion 24 of well region 12 and a portion of semiconductor substrate 10 adjacent to p-n junction 16. Accordingly, once gate electrode 22 is formed, it overlies p-n junction 16, which resides in the region normally occupied by a channel region in a conventional MOS transistor. Preferably, gate electrode 22 is formed by CVD of a polycrystalline silicon layer to a thickness of about 2,000 to about 4,000 angstroms and, more preferably, about 2,500 angstroms.

Following the deposition of the polycrystalline silicon layer, the polycrystalline is doped to have an n-type conductivity. In a preferred process, the polycrystalline silicon is doped by the ion implantation of phosphorous using a dose of preferably about $2 \times 10^{15}$ ions/cm$^2$ to about $4 \times 10^{15}$ ions/cm$^2$ and, more preferably, about $3 \times 10^{15}$ ions/cm$^2$. Alternatively, the polysilicon could remain undoped at this point in the process. Next, conventional lithographic patterning and ion etching processes are carried out to define gate electrode 22.

Figure 3:
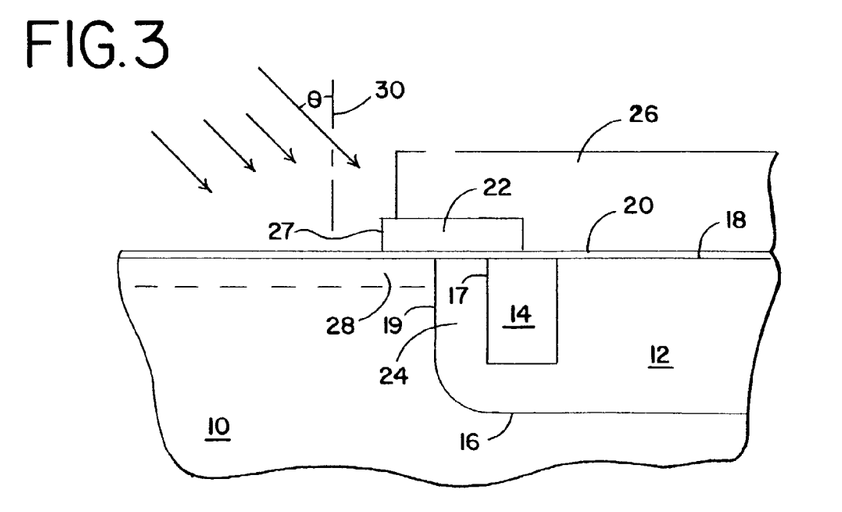

Once gate electrode 22 is formed, a lithographic pattern 26 is formed on semiconductor substrate 10, as illustrated in FIG. 3. Preferably, lithographic pattern 26 is formed by spin-coating a layer of photoresist onto semiconductor substrate 10, followed by exposure and development to form a predefined pattern. Depending upon the dimensional requirements of the particular device being fabricated, lithographic processing, such as that used to form lithographic pattern 26, can be carried out using other resist materials, such as deep UV resist, chemically-amplified resist, x-ray resist materials and the like. Preferably, lithographic pattern 26 protects the portion of well region 12 that is not underneath the gate electrode 22, and at least a portion gate electrode 22, during subsequent processing.

Following the formation of lithographic pattern 26, a doping process is carried out to form a channel region 28, underlying a portion of gate electrode 22, as illustrated in FIG. 3. In a preferred processing embodiment, channel region 28 is formed by the angled ion implantation of doping atoms into semiconductor substrate 10 using lithographic pattern 26 and an edge 27 of gate electrode 22 as a doping mask. The angled ion implantation process is carried at an angle of incidence $\theta$ with respect to a normal line 30 of principal surface 18. The angled ion implantation process drives dopant atoms into substrate 10, such that dopant atoms are driven into a region beneath gate electrode 22. In a preferred processing embodiment, for the fabrication of an n-channel high-voltage transistor, boron ions are implanted into semiconductor substrate 10 at an angle of incidence of about 30° to 55° and, more preferably, about 40° to 50° and, most preferably, about 45° with respect to normal line 30. Preferably, the ion implantation process is carried out at an implantation energy such that boron ions are injected to a depth sufficient to form a channel region beneath gate electrode 22. In a preferred process, boron is implanted at an energy of about 30 keV to about 60 keV and, more preferably, about 50 keV.

Those skilled in the art will recognize that a variety of techniques are available for carrying out an angled ion implantation process. In a preferred method, semiconductor substrate 10 is positioned in the ion beam at the offset angle and rotated about a rotational axis during the ion implantation process. To form channel region 28 to have a desired doping concentration, in the preferred method, a boron dose of about $1.0 \times 10^{13}$ to about $2.0 \times 10^{13}$ ions/cm$^2$ and, more preferably, about $1.6 \times 10^3$ ions/cm$^2$ is implanted during each rotation of semiconductor substrate 10.

Those skilled in the art will appreciate that the foregoing parameters are dependent on the particular ionic species being implanted. In accordance with the invention, the ion implantation process can be carried out with molecular ions, such as $BF_2$, $BF_3$, $B_2$ and the like. The ion implantation parameters will vary depending upon the particular ionic species that is implanted to form channel region 28.

After forming channel region 28, lithographic pattern 26 is removed and a thermal annealing process is carried out to partially diffuse the implanted boron ions. In a preferred method, a convective annealing process is carried out at about 800° C. to about 900° C. and, more preferably, at about 850° C. for about 20 to about 40 minutes, and most preferably, about 30 minutes. Additionally, the preferred annealing process is carried out in an oxidizing atmosphere to form a silicon oxide layer 29 on gate electrode 22. Alternatively, this annealing step could also be performed after the subsequent, lightly-doped source, implant. It is important to note that the relatively brief annealing process used in the present invention is carried out at a temperature and time that is much reduced from that used in a typical DMOS process.

Figure 4:
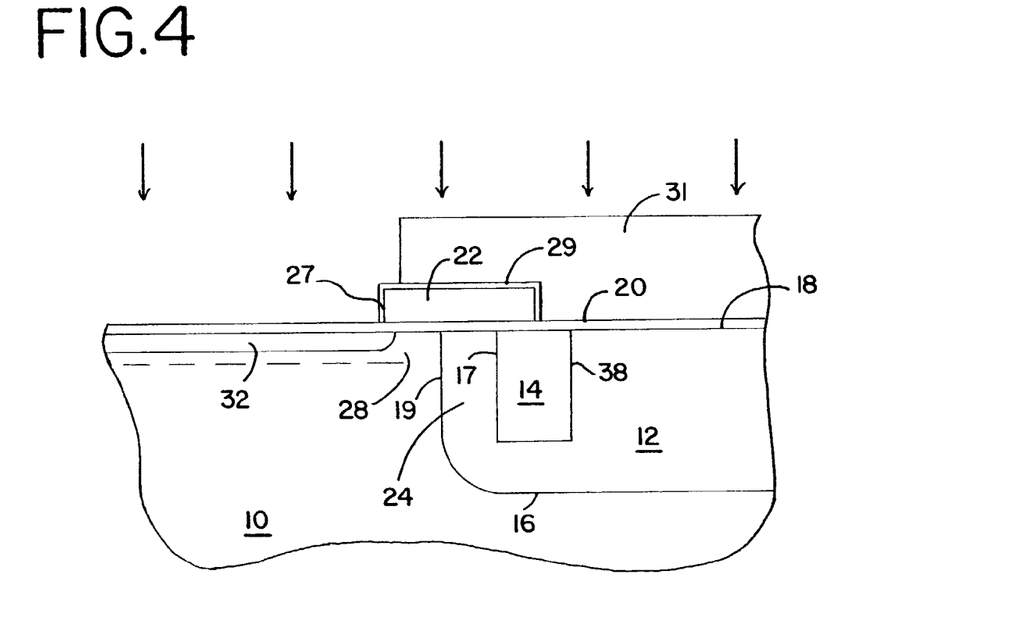

Once channel region 28 is formed, in a preferred embodiment, another lithographic pattern 31 is formed and a doping process is carried out to form a lightly-doped source region 32 in semiconductor substrate 10. As illustrated in FIG. 4, lightly-doped source region 32 is spatially aligned to end at edge 27 of gate electrode 22. Preferably lightly-doped source region 32 is formed by ion implantation of a n-type dopant, such as phosphorous or arsenic. Preferably, the process used to form lightly-doped source region 32 is an integral part of a typical CMOS fabrication process using lightly-doped-drained (LDD) fabrication technology. In the process for the fabrication of a high-voltage transistor in accordance with the present invention, the formation of lightly-doped source region 32 is an optional processing step. Those skilled in the art will recognize that many different kinds of high-voltage transistors can achieve optimal functionality without the aid of LDD process technology.

Figure 5:
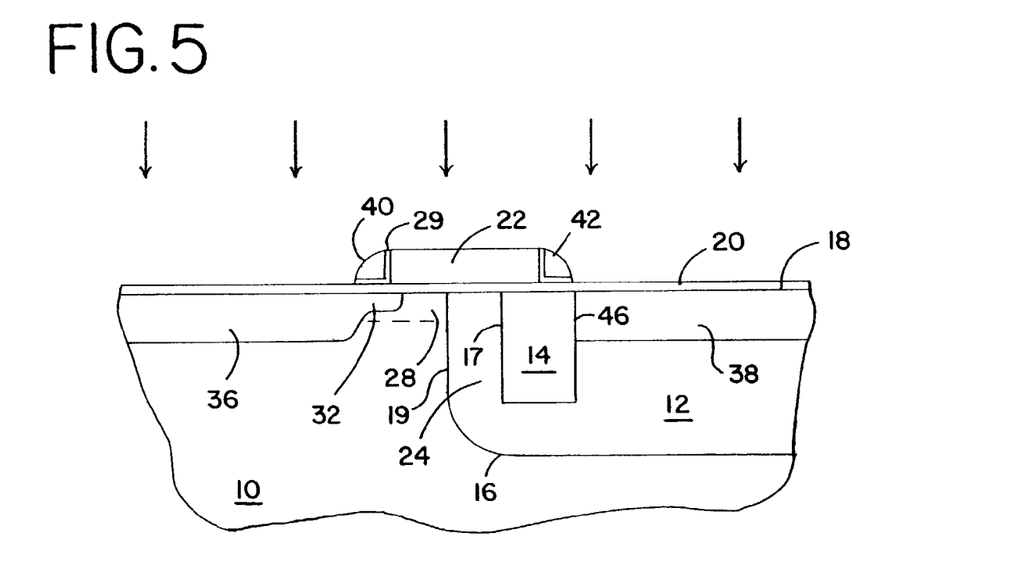

As illustrated in FIG. 5, fabrication of the major components of the high-voltage transistor of the invention can be completed with the formation of a source region 36 and a drain contact region 38. Preferably, source and drain contact regions 36 and 38 are formed by doping semiconductor substrate 10 with an n-type dopant, such as arsenic or phosphorous. In a preferred embodiment, source and drain regions 36 and 38 are formed by the ion implantation of arsenic using a dose of about $2 \times 10^{15}$ to about $4 \times 10^{15}$ ions/cm$^2$ and, more preferably, $3 \times 10^{15}$ ions/cm$^2$. If the polysilicon had not been doped earlier in the process, it would be doped by the source/drain implants. Where LDD process technology is applied to the fabrication of the high-voltage transistor, sidewall spacers 40 and 42 are formed adjacent to gate electrode 22. In a preferred embodiment, sidewall spacers 40 and 42 are formed by depositing a layer of silicon nitride overylying silicon oxide layer 29. To complete the formation of sidewall spacers 40 and 42, the silicon nitride layer is anisotropically etched. Silicon oxide layer 29 is used as an etch-stop layer during the anisotropic etching process.

The preferred process is carried out to self-align source region 36 to gate electrode 22 and sidewall spacer 40. As illustrated in FIG. 5, drain contact region 38 is spatially aligned to end at edge 46 of isolation region 14. Accordingly, drain contact region 38 is separated from channel region 28 by isolation region 14 and by portion 24 of well region 12. By separating drain contact region 38 from channel region 28, the magnitude of the electric field between gate electrode 22 and drain region 38 is reduced, which, in turn, reduces the amount of charge injected into the gate oxide from the drain region during operation of the high-voltage transistor. Portion 24 of well region 12 acts as an extension region for drain contact region 38.

In accordance with the invention, channel region 28 is formed in substrate 10 and extends from principal surface 18 a predetermined distance to a certain junction depth. In a preferred embodiment, the junction depth is determined by the angled implant process described above. Alternatively, a second implant process can be carried out to set the threshold voltage of channel region 28, in which the second implant has a predetermined implant depth in channel region 28. Preferably, such an implant is performed prior to the gate electrode deposition. Also, as described above, drain contact region 38 is formed in well region 12 and, as illustrated in FIG. 5, extends into well region 12 from principal surface 18 to a certain junction depth.

For optimum performance of the high-voltage transistor it is desirable that the junction depth of theshold implant not exceed the junction depth of drain region 38. In a preferred embodiment, the junction depth of the threshold implant in channel region 28 does not exceed more than about 10% to 50% of the junction depth of drain region 38.

Those skilled in the art will appreciate that, as an alternative to the foregoing process, a high-voltage transistor can be fabricated using well region 12 as the complete drain region. In an alternative embodiment, rather than forming a drain region, an electrical contact is formed to well region 12. The electrical contact can be one of a number of different electrical contacts, such as a buried junction, a doped region at substrate surface joined to a metal lead, a backside contact and the like. Regardless of the particular type of electrical contact, in accordance with the invention the electrical contact is separated from channel region 28 by isolation region 14.

Figure 6:
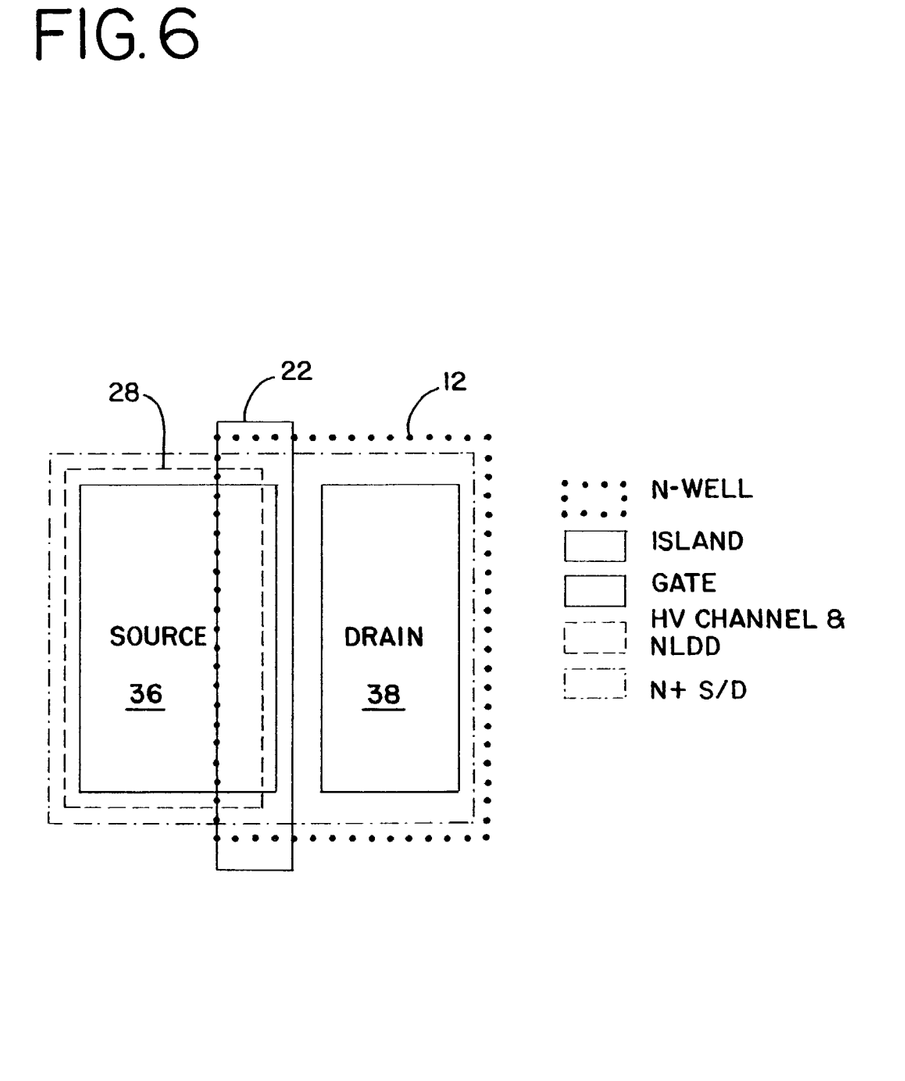
FIG. 6 illustrates a lithographic mask layout of a high-voltage transistor arranged in accordance with the invention.

A lithographic mask layout of the high-voltage transistor fabricated in accordance with the invention is illustrated in FIG. 6. As illustrated in the layout, the mask for gate electrode 22 is generally aligned with the mask for edge of well region 12. Channel region 28 is implanted and subsequently diffused under a portion of gate electrode 22. Since channel region 28 extends away from gate electrode 22 in semiconductor substrate 10, channel region 28 can be electrically contacted in regions of semiconductor substrate 10 away from gate electrode 22.

A particular advantage of the fabrication process of the invention relates to the ease with which the process can be integrated with a conventional CMOS process. All of the foregoing steps with the exception of the channel formation process are standard processing steps typically found in CMOS device fabrication. Accordingly, the high-voltage transistor of the invention can be readily fabricated simultaneously with low-voltage transistors in a conventional CMOS fabrication process.

Those skilled in the art will appreciate that high-voltage transistors, such as that illustrated in FIG. 5, are typically fabricated in association with low-voltage transistors. Accordingly, in a further embodiment of the invention, a device and fabrication process are provided that includes low-voltage transistors and high-voltage transistors.

Figure 7:
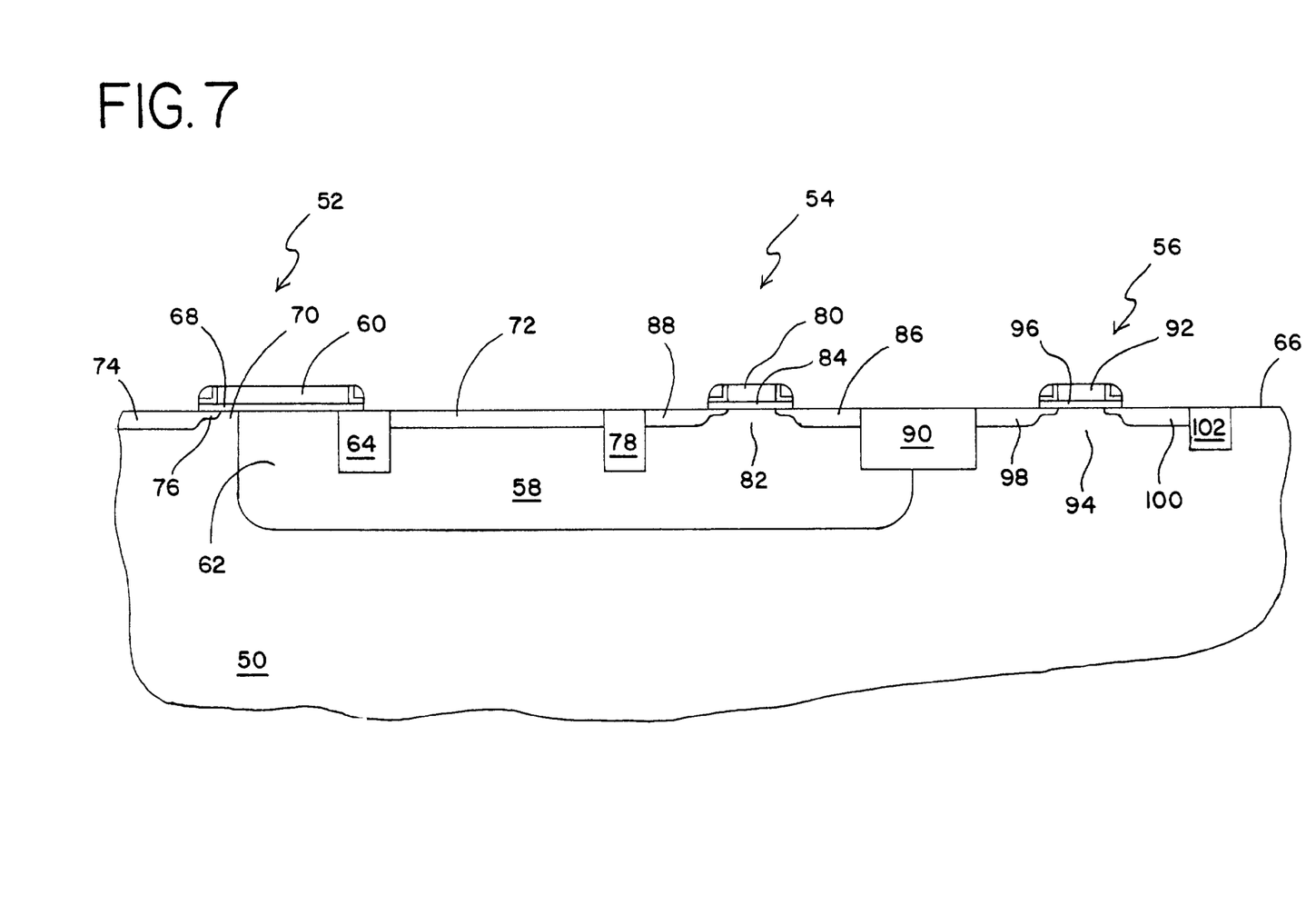
FIG. 7 is a cross-sectional view of a portion of a semiconductor substrate that includes a high-voltage transistor and first and second low-voltage transistors.

Shown in FIG. 7 is a cross-sectional view of a portion of a semiconductor substrate 50 that includes a high-voltage transistor 52 and first and second low-voltage transistors 54 and 56. A well region 58 resides in semiconductor substrate 50. In accordance with high-voltage transistors of the invention, high-voltage transistor 52 includes a gate electrode 60 overlying a portion 62 of well region 58 and a portion of an isolation region 64 and is separated from a principal surface 66 of semiconductor substrate 50 by a gate dielectric layer 68. A channel region 70 underlies at least a portion of gate electrode 60 and is separated from isolation region 64 by portion 62 of well region 58. A drain region 72 resides in well region 58 and is spaced apart from channel region 70 by isolation region 64 and by portion 62 of well region 58. A source region 74 resides in substrate 50 and is spaced apart from an edge of gate electrode 60 and is further separated from isolation region 64 by channel region 70 and portion 68 of well region 58. A source extension region 76 also resides in substrate 50 intermediate to source region 74 and channel region 70.

First low-voltage transistor 54 resides in well region 58 and is separated from high-voltage transistor 52 by drain region 72 and by an isolation region 78. First low-voltage transistor 54 includes a gate electrode 80 overlying a channel region 82 and separated therefrom by a gate dielectric layer 84. A source region 86 and a drain region 88 reside in well region 58 and are separated by channel region 82. Source and drain regions 86 and 88 also include extension regions residing adjacent channel region 82.

Second low-voltage transistor 56 resides semiconductor substrate 50 and is separated from first low-voltage transistor 54 by an isolation region 90. Second low-voltage transistor 56 includes a gate electrode 92 overlying a channel region 94 and separated therefrom by a gate dielectric layer 96. A source region 98 and a drain region 100 reside in semiconductor substrate 50 and are separated by channel region 94. An isolation region 102 is located in semiconductor substrate 50 adjacent to drain region 100 and electrically isolates second low-voltage transistor 56 from remaining portions of semiconductor substrate 50. In similarity with first low-voltage transistor 54, source and drain regions 98 and 100 also include extension regions, which reside adjacent to channel region 94.

The device illustrated in FIG. 7 can be fabricated, in part, in accordance with a conventional retrograde well process. After forming isolation regions 64, 78, 90 and 102, well region 58 is preferably formed by a lithographic masking and ion implantation process. Alternatively, well region 58 can be formed by diffusing a dopant species into semiconductor substrate 50. Next, threshold adjustment implants are made into channel regions 82 and 94, and a gate oxidation process is carried out to form gate dielectric layers 68, 84 and 96. Next, a polysilicon layer is deposited and patterned to form gate electrodes 60, 80, and 92.

In accordance with the invention, the channel-forming process for high-voltage transistor 52 is carried out at this point in the retrograde well process. As described above, an angled implant process is carried out to form channel region 70 in high-voltage transistor 52. It is important to note that the angled implant process forms channel region 70 without an extensive thermal diffusion process. A particular problem associated with the fabrication a device containing both low-voltage and high-voltage transistors is the unwanted thermal diffusion of previously-formed threshold implants and well regions. Proper functioning of the device requires that previously-formed junctions not be further diffused by the subsequent thermal processing that accompanies the formation of a diffused channel region. In accordance with the invention, the previously-formed junctions are preserved by forming channel region 70 using an angled implant process rather than a thermal diffusion process.

After forming channel region 70, the process continues with the formation of conventional LDD structures and sidewall spacers for transistors 52, 54 and 56. Importantly, because substantial thermal processing is avoided during formation of channel region 70 in high-voltage transistor 52, the junction depth of channel region 70 is substantially less that that of the source and drain regions of first and second low-voltage transistors 54 and 56. Accordingly, the process of the invention produces a device having both high-voltage and low-voltage transistors having relatively shallow junction depths. In particular, the junction depth of the source and drain regions of the low-voltage transistors can be maintained at less than about 50% of the junction depth of the source and drain regions of the low-voltage transistors. By maintaining the junction depth and profile of diffused regions within the device, optimum electrical performance can be attained.

Thus, it is apparent that there has been described a high-voltage transistor and fabrication process which fully provides the advantages set forth above. Those skilled in the art will appreciated that various modifications can be made without departing from the spirit and scope of the invention. For example, materials such as refractory-metal silicides can be used to fabricate the gate electrode and portions of the source and drain regions. Additionally, doping processes such as molecular bean implantation, and the like, can be used to fabricate doped regions in the semiconductor substrate. Accordingly, all such variations are intended to be included in the appended claims and equivalent thereof.

What is claimed is:

1. A process for fabricating a high-voltage transistor comprising the steps of:
   providing a substrate having a principal surface and having a first region and a second region therein, wherein an isolation region resides within the first region;
   forming a gate dielectric layer overlying the principal surface;
   forming a gate electrode overlying a portion of the first region, a portion of the second region and a portion of the isolation region;
   implanting ions at an angle of incidence of more than 30° to about 55° with respect to the normal into the substrate to form a channel region in the second region and beneath the gate electrode using the gate electrode as an implant mask, wherein the ions are implanted at an angle of incidence offset from a normal of the principal surface, and wherein the ions are implanted with an implantation dose of about $1.0 \times 10^{13}$ to about $2.0 \times 10^{13}$ ions/cm$^2$; and
   doping the substrate to form a source region and a drain contact region in the substrate,
   wherein the source region resides in the second region and the drain contact region resides in the first region, and
   wherein the drain contact region is separated from the channel region by the isolation region and a portion of the first region.

2. The process of claim 1, wherein the step of forming a channel region further comprises annealing the substrate at a temperature of about 800° C. to about 900° C.

3. The process of claim 1, wherein the step of implanting comprises implanting boron at an implant energy of about 30 keV to about 60 keV.

4. The process of claim 1 further comprising the step of forming a lightly-doped source region in the second well region intermediate to the channel region and the source region.

5. The process of claim 1, wherein the step of providing an isolation region comprises forming a trench in the first well region and filling the trench with a material selected from the group consisting of an insulator material and a dielectric material.

6. The process of claim 5, wherein the step of forming a trench comprises forming a trench having a depth of about 0.25 to about 0.5 microns.

7. The process of claim 1, wherein the step of forming source and drain regions comprises ion implantation of phosphorus at an implant dose of about $2 \times 10^{15}$ to about $4 \times 10^{15}$ ions/cm$^2$.

8. A process for fabricating a high-voltage transistor comprising the steps of:
   providing a substrate having substrate surface;
   forming a well region in the substrate;
   forming a trench in the well region and filling the trench with an insulator material to form an isolation region;
   forming a gate dielectric layer overlying the substrate surface;
   forming a gate electrode overlying a portion of the well region and a portion of the isolation region in the trench and separated from the substrate surface by the gate dielectric layer; and
   forming a channel region in the substrate after forming the gate electrode,
   wherein the channel region underlies at least a portion of the gate electrode.

9. The process of claim 8 further comprising the step of forming a drain region in the well region, wherein the drain region is spaced apart from the channel region by the isolation region and a portion of the well region.

10. The process of claim 8, wherein the step of forming a channel region comprises angled ion implantation using a implant angle of about 30° to about 55° with respect to a normal to the substrate surface.

11. The process of claim 8, wherein the step of filling the trench with an insulator material comprises depositing silicon oxide.

12. The process of claim 11 further comprising the step of planarizing the silicon oxide.

13. The process of claim 8 further comprising the step of forming a source region in the substrate spaced apart from the gate electrode and separated from the isolation region by the channel region and a portion of the well region.

14. The process of claim 13 further comprising the step of forming a lightly-doped source region in the substrate intermediate to the source region and the channel region.

15. A process for fabricating a high-voltage transistor comprising the steps of:
   providing a substrate having a principal surface and having a first region and a second region therein, wherein an isolation region resides within the first region;
   forming a gate dielectric layer overlying the principal surface;
   forming a gate electrode overlying at least a portion of the first region, a portion of the second region and a portion of the isolation region;
   implanting ions into the substrate to form a channel region in the second region and beneath the gate electrode using the gate electrode as an implant mask, wherein the ions are implanted at an angle of incidence of more than 30° to about 55° with respect to a normal of the principal surface, and wherein the ions are implanted with an implantation dose of about $1.0 \times 10^{13}$ to about $2.0 \times 10^{13}$ ions/cm$^2$; and
   forming an electrical contact to the first region, wherein the electrical contact is separated from the channel region by the isolation region.

16. The process of claim 15, wherein the step of providing a substrate having a second region comprises providing an undoped substrate.

17. The process of claim 15, wherein the step of providing a substrate having a second region comprises providing a substrate having a second well region.

18. The process of claim 17, wherein the step of providing a first well region comprises doping the substrate with a conductivity-determining dopant of a first conductivity type.

19. The process of claim 17, wherein the step of providing a substrate having a second well region comprises doping the substrate with a conductivity-determining dopant of a second conductivity type.

20. The process of claim 17, wherein the step of implanting ions to form a channel region comprises implanting ions of a second conductivity type.

21. A process for fabricating a high-voltage transistor comprising the steps of:
   providing a substrate having a principal surface and having a first region and a second region therein, wherein an isolation region resides within the first region;
   forming a gate dielectric layer overlying the principal surface;
   forming a gate electrode overlying a portion of the first region, a portion of the second region and a portion of the isolation region;
   implanting ions into the substrate to form a channel region in the second region and beneath the gate electrode using the gate electrode as an implant mask, wherein the ions are implanted at an angle of incidence offset from a normal of the principal surface; and doping the substrate to form a source region and a drain contact region in the substrate, wherein the source region resides in the second region and the drain contact region resides in the first region, and wherein the drain contact region is separated from the channel region by the isolation region and a portion of the first region;

wherein the isolation region is formed by forming a trench and filling the trench with an insulator material, and wherein the gate electrode is formed overlying the portion of the isolation region in the trench.

22. A process for fabricating a high-voltage transistor comprising the steps of:

providing a substrate having a principal surface and having a first region and a second region therein, wherein an isolation region resides within the first region;

forming a gate dielectric layer overlying the principal surface;

forming a gate electrode overlying at least a portion of the first region, a portion of the second region and a portion of the isolation region;

implanting ions into the substrate to form a channel region in the second region and beneath the gate electrode using the gate electrode as an implant mask, wherein the ions are implanted at a angle of incidence offset from a normal of the principal surface; and forming an electrical contact to the first region, wherein the electrical contact is separated from the channel region by the isolation region;

wherein the isolation region is formed by forming a trench and filling the trench with an insulator material, and wherein the gate electrode is formed overlying the portion of the isolation region in the trench.

* * * * *